United States Patent
Kitane

(10) Patent No.: US 9,995,811 B2
(45) Date of Patent: Jun. 12, 2018

(54) MAGNETIC RESONANCE IMAGING APPARATUS

(71) Applicant: TOSHIBA MEDICAL SYSTEMS CORPORATION, Otawara-Shi, Tochigi-Ken (JP)

(72) Inventor: Shinichi Kitane, Nasushiobara (JP)

(73) Assignee: TOSHIBA MEDICAL SYSTEMS CORPORATION, Otawara-Shi, Tochigi-Ken (JP)

(*) Notice: Subject to any disclaimer, the term of this patent is extended or adjusted under 35 U.S.C. 154(b) by 1264 days.

(21) Appl. No.: 13/740,523

(22) Filed: Jan. 14, 2013

(65) Prior Publication Data

US 2013/0193972 A1 Aug. 1, 2013

(30) Foreign Application Priority Data

Jan. 13, 2012 (JP) .................. 2012-005244

(51) Int. Cl.
*G01R 33/56* (2006.01)
*G01R 33/48* (2006.01)

(52) U.S. Cl.
CPC ......... *G01R 33/56* (2013.01); *G01R 33/4818* (2013.01); *G01R 33/5607* (2013.01)

(58) Field of Classification Search
CPC ............ G01R 33/5607; G01R 33/4818; G01R 33/56; G01R 33/4838
USPC ............................ 324/300–322; 600/407–422
See application file for complete search history.

(56) References Cited

U.S. PATENT DOCUMENTS

| 6,272,369 | B1 | 8/2001 | Tan | |
|---|---|---|---|---|
| 7,990,140 | B2 | 8/2011 | Sugiura | |
| 2007/0052415 | A1 | 3/2007 | Asano | |
| 2007/0205769 | A1* | 9/2007 | Yui | G01R 33/5614 324/318 |

(Continued)

FOREIGN PATENT DOCUMENTS

| CN | 101273892 A | 10/2008 |
|---|---|---|
| CN | 101401723 A | 4/2009 |

(Continued)

OTHER PUBLICATIONS

English translation of JP 2004-089515.*

(Continued)

*Primary Examiner* — Rishi Patel
(74) *Attorney, Agent, or Firm* — Nixon & Vanderhye P.C.

(57) ABSTRACT

A magnetic resonance imaging apparatus of an embodiment has a setting unit configured to set a pulse sequence having a pre-pulse for fat suppression and a pulse train for data acquisition for acquiring echo data for image reconstruction, the pulse sequence being provided with a plurality of dummy pulses between the pre-pulse for fat suppression and the head of the pulse train for data acquisition, a data acquisition unit configured to apply an RF pulse and a gradient magnetic field pulse based on the pulse sequence set by the setting unit to a test object so as to acquire the echo data, and an image generation unit configured to reconstruct an image of the test object from the acquired echo data, wherein an application time during which the plural dummy pulses are applied or flip angles of the plural dummy pulses can be adjusted.

13 Claims, 14 Drawing Sheets

(56) References Cited

U.S. PATENT DOCUMENTS

| | | | |
|---|---|---|---|
| 2008/0064951 A1* | 3/2008 | Kitane | A61B 5/055 |
| | | | 600/413 |
| 2008/0224697 A1* | 9/2008 | Saranathan et al. | G01R 33/48 |
| | | | 324/307 |
| 2008/0238421 A1 | 10/2008 | Kitane et al. | |
| 2008/0238422 A1 | 10/2008 | Yui | |
| 2009/0091324 A1 | 4/2009 | Sugiura | |
| 2009/0273343 A1* | 11/2009 | Borthakur | A61B 5/055 |
| | | | 324/307 |
| 2010/0060277 A1* | 3/2010 | Nezafat | G01R 33/5635 |
| | | | 324/309 |
| 2010/0194388 A1 | 8/2010 | Kitane et al. | |
| 2010/0249574 A1 | 9/2010 | Miyazaki | |
| 2011/0210736 A1 | 9/2011 | Abe | |
| 2013/0193971 A1 | 8/2013 | Kitane et al. | |

FOREIGN PATENT DOCUMENTS

| | | |
|---|---|---|
| JP | 2000-225107 | 8/2000 |
| JP | 2004-089515 | 3/2004 |
| JP | 2007-068796 | 3/2007 |
| JP | 2008-264499 | 11/2008 |
| JP | 2009/101133 A | 5/2009 |
| JP | 2010/220859 A | 10/2010 |
| WO | 2010/053012 A | 5/2010 |

OTHER PUBLICATIONS

English translation of JP2004-089515 by AIPN Japanese Patent Office. Translation obtained Jan. 24 2017.*
CN Office Action dated Aug. 18, 2014 in CN 201310003580.5.
JP Office Action dated Oct. 20, 2015 in JP 2012-005244.
JP Office Action dated Sep. 26, 2017 in JP 2016-159264.

* cited by examiner

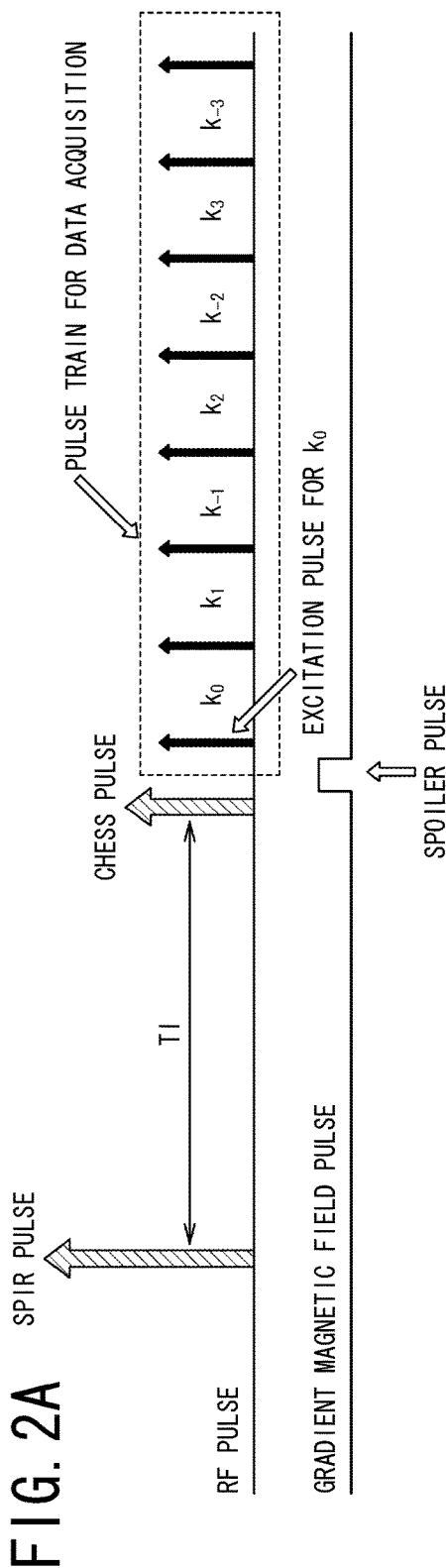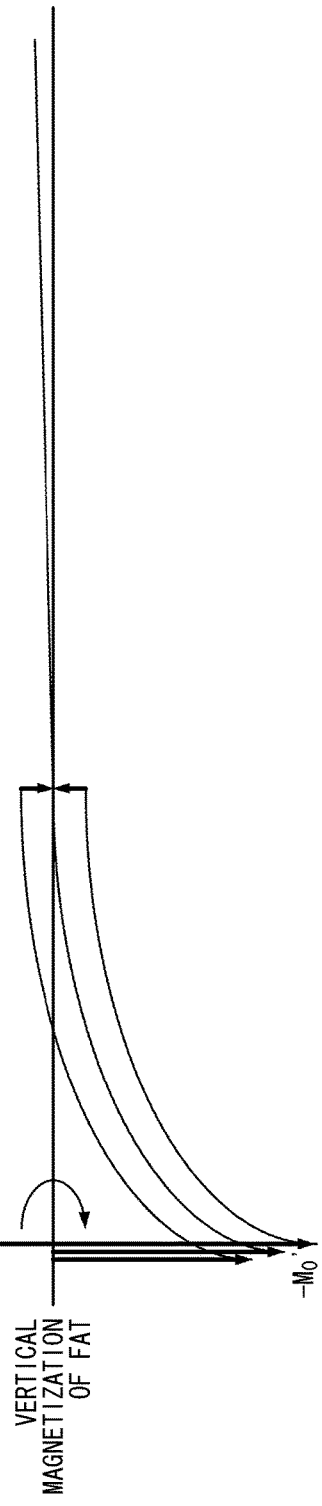
FIG. 2A
FIG. 2B

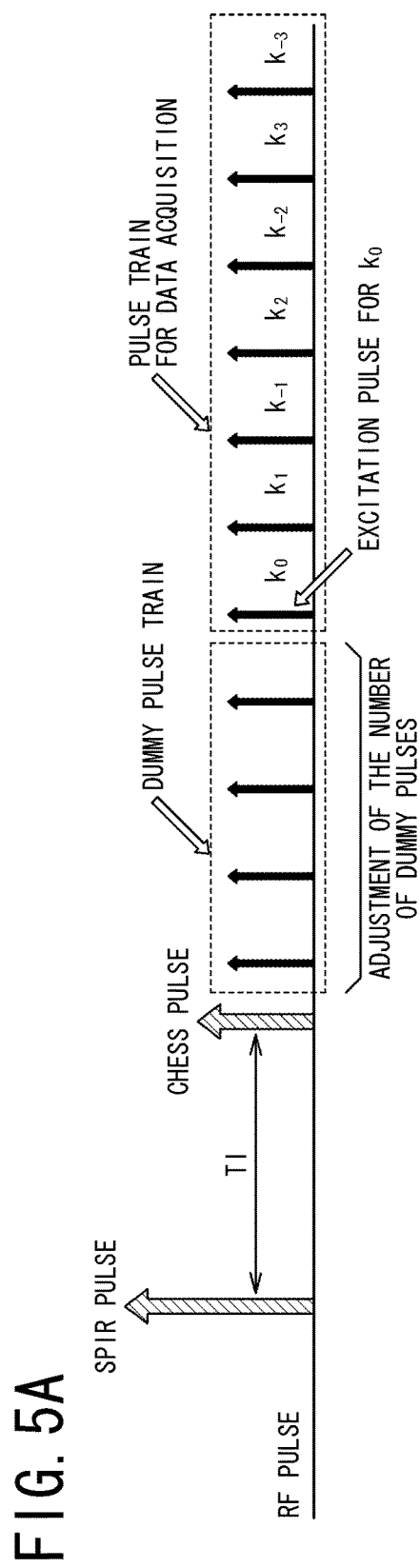
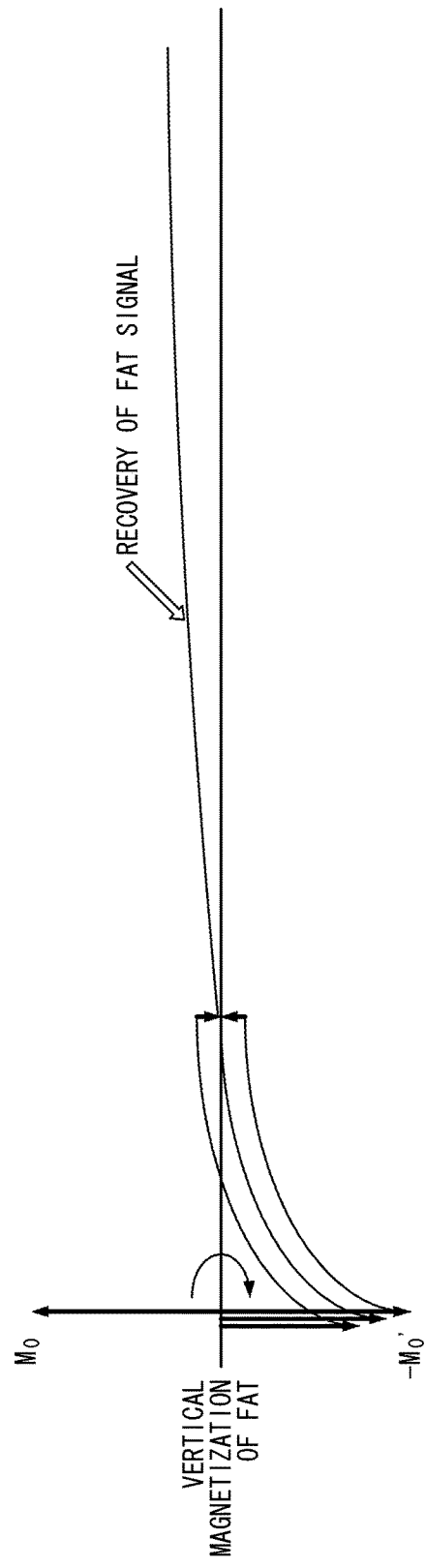
FIG. 5A
FIG. 5B

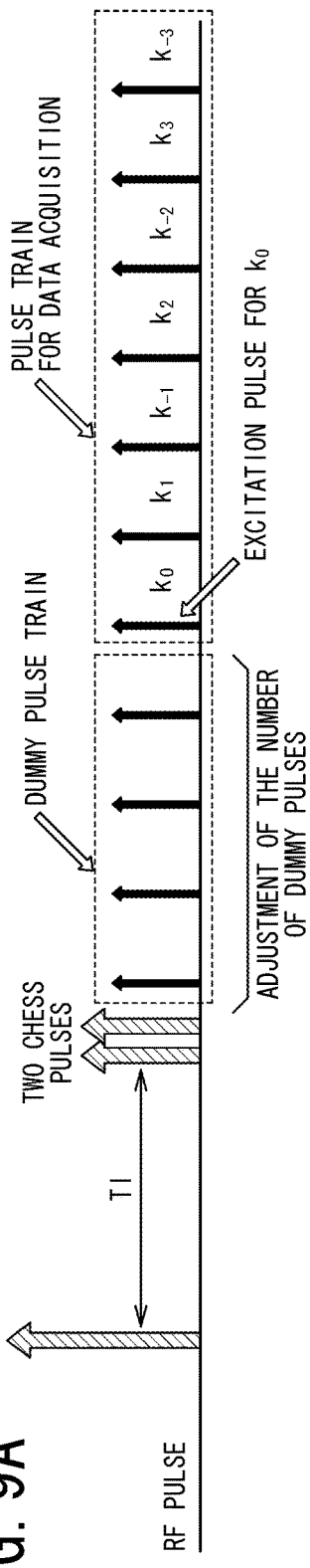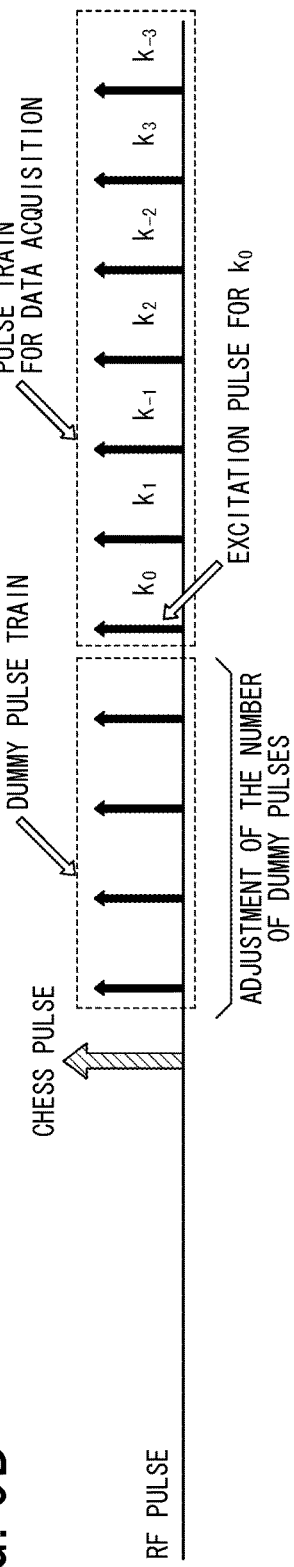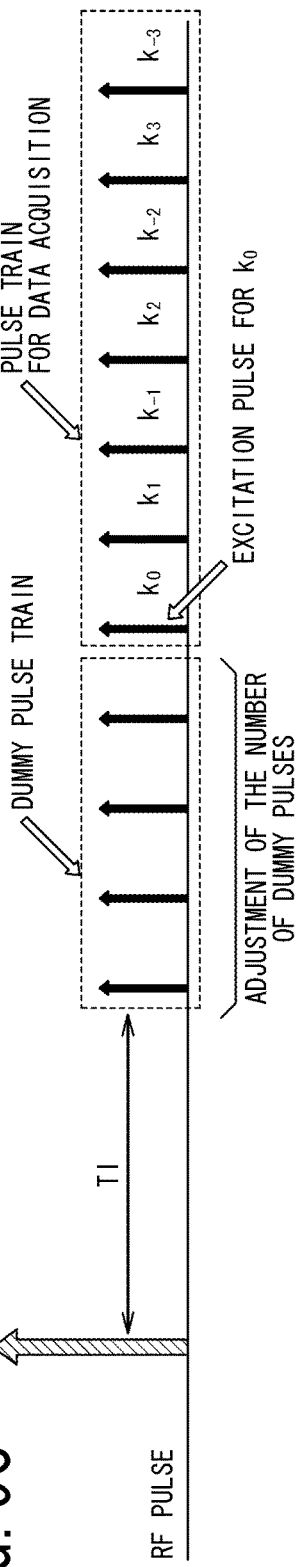

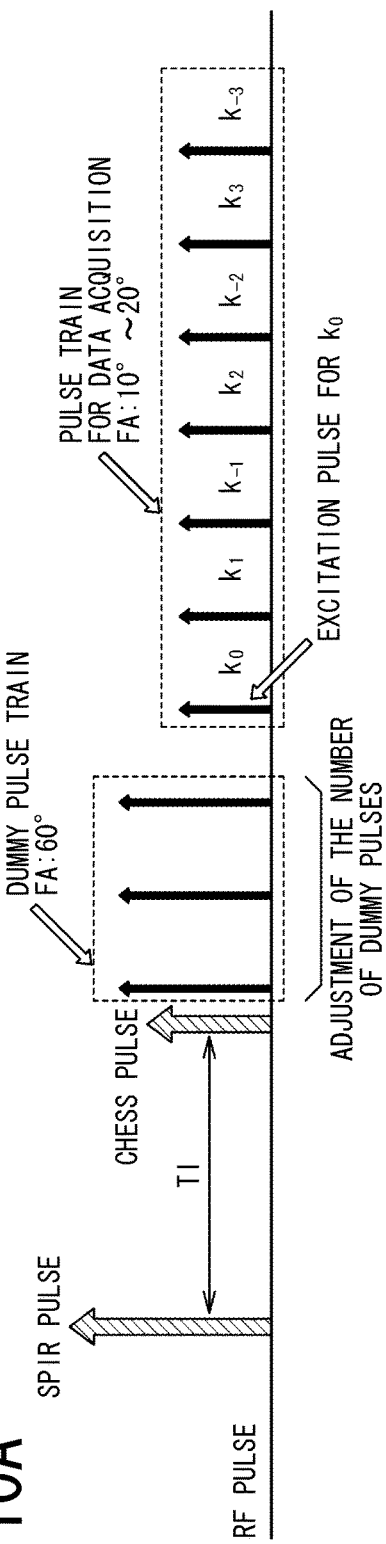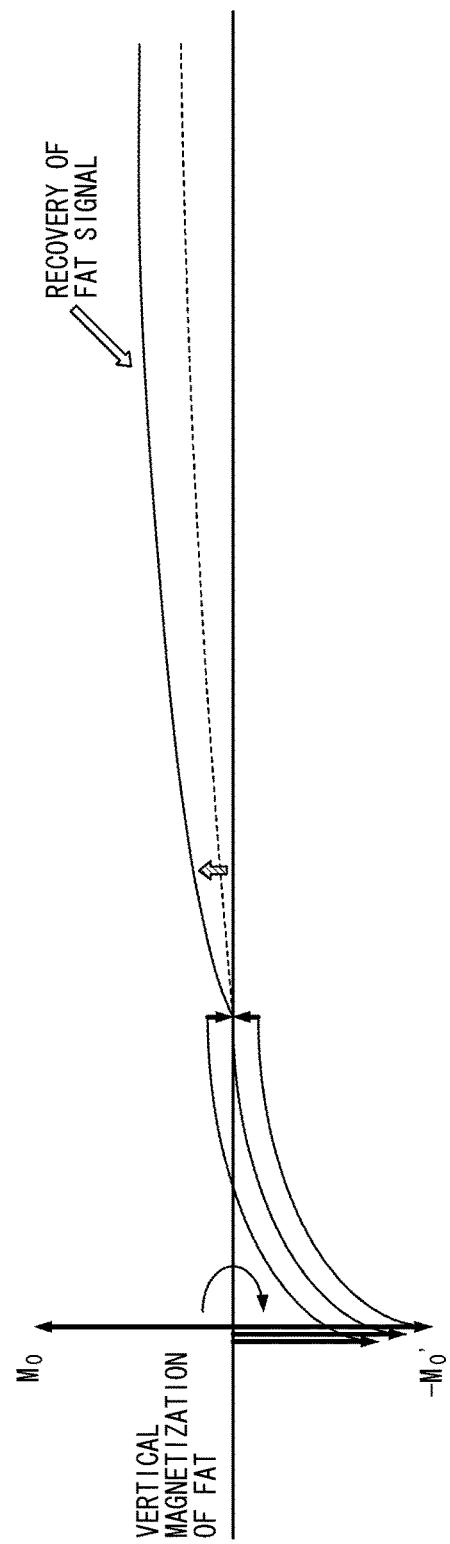

PULSE FOR DATA ACQUISITION
USED AS DUMMY PULSE

PULSE FOR DATA ACQUISITION
USED AS DUMMY PULSE

PULSE FOR DATA ACQUISITION
USED AS DUMMY PULSE

PULSE FOR DATA ACQUISITION
USED AS DUMMY PULSE

MAGNETIC RESONANCE IMAGING APPARATUS

CROSS-REFERENCE TO RELATED APPLICATIONS

This application is based upon and claims the benefit of priority from Japanese Patent Application No. 2012-005244 filed on Jan. 13, 2012, the entire contents of which are incorporated herein by reference.

FIELD

The invention relates to a magnetic resonance imaging apparatus.

BACKGROUND

A magnetic resonance imaging apparatus is an imaging apparatus which excites a nuclear spin of a test object put in a static magnetic field by using an RF (Radio Frequency) signal of a Larmor Frequency, and reconstructs an image from a magnetic resonance signal produced from the test object together with the excitation.

Various kinds of fat suppression methods for suppressing a signal coming from fat in a test object (fat signal) as an unwanted signal are known in the field of magnetic resonance imaging. Fat suppression methods ordinarily used in general include a CHESS (chemical shift selective) method, a SPIR (spectral presaturation with inversion recovery) method (called SPECIR as well), a STIR (short TI inversion recovery) method, etc.

Among those methods, the CHESS method is a method for frequency selectively suppressing only a fat signal by using a fact that resonance frequencies of water and fat protons differ from each other by 3.5 ppm. Thus, the CHESS method is called a frequency selective fat suppression method, as well. According to the CHESS method, an RF pulse having a resonance frequency of fat (called a CHESS pulse) is applied to the test object at a flip angle of usually 90 degrees before acquiring data. The application of the CHESS pulse causes only vertical magnetization of fat to fall frequency selectively by 90 degrees. Then, if a gradient magnetic field pulse called a spoiler pulse is applied, horizontal magnetization of fat disperses and disappears. Then, if data acquisition begins after the spoiler pulse is applied, data can be acquired in condition such that a fat signal is suppressed.

The SPIR method is one of frequency selective fat suppression methods which use the difference of resonance frequencies between the water and fat protons, as well. According to the SPIR method as well, an RF pulse having a resonance frequency of fat (called a SPIR pulse) is applied to the test object before acquiring data. A flip angle of the SPIR pulse is usually set between 90 and 180 degrees, though. If the SPIR pulse is applied, vertical magnetization of fat falls frequency selectively by an angle according to the flip angle. As the flip angle of the SPIR pulse is between 90 and 180 degrees, the vertical magnetization of fat turns negative immediately after the application. Then, the vertical magnetization of fat increases as time passes owing to vertical relaxation, and recovers from the negative value, by way of a null point and up to a positive value. A recovery rate of the vertical magnetization is determined by the vertical relaxation (T1 relaxation) of fat. A period of time between the application of the SPIR pulse and the beginning of data acquisition for image reconstruction (more strictly speaking, application of a first excitation pulse for data acquisition) is called inversion time (TI) in the SPIR method. If the above inversion time is made to agree with a period of time since the SPIR pulse was applied until the vertical magnetization crosses the null point in the SPIR method, data can be acquired only from a water signal in condition such that a fat signal is suppressed.

In contrast to the above two imaging methods which are both frequency selective fat suppression methods, the STIR method is a frequency non-selective fat suppression method. The STIR method is an imaging method for suppressing fat by actively using a difference in vertical relaxation time (T1 relaxation time) between fat and water signals, i.e., by using a fact that the vertical relaxation time of the fat signal is shorter than the vertical relaxation time of the water signal. A frequency non-selective pulse (STIR pulse) of a flip angle of 180 degrees is applied to a test object before acquiring data, and this makes vertical magnetization of fat and water protons fall by 180 degrees at the same time so that both are rendered negative. After the STIR pulse is applied, the vertical magnetization of the fat proton recovers in a positive direction and so does that of the water proton. As the vertical relaxation time of the fat signal is shorter than the vertical relaxation time of the water signal, the vertical magnetization of the fat signal first reaches the null point. A period of time between the application of the STIR pulse and the beginning of data acquisition for image reconstruction (more strictly speaking, application of a first excitation pulse for data acquisition) is called inversion time (TI) in the STIR method, similarly as in the SPIR method. If the above inversion time is made to agree with a period of time since the STIR pulse was applied until the vertical magnetization crosses the null point in the STIR method, data can be acquired only from the water signal in condition such that the fat signal is suppressed.

As being a frequency non-selective fat suppression method, the STIR method has an advantage of being hardly affected by unevenness of a static magnetic field. In time of data acquisition, though, vertical magnetization of a water signal (negative value) is smaller than that in a case where no STIR pulse is applied, and thus there is a shortcoming in that an SNR decreases or that it takes a long time for imaging to achieve a specific SNR.

Meanwhile, as the CHESS method is a frequency selective fat suppression method and so is the SPIR method, vertical magnetization of a water signal is not affected by application of a CHESS pulse or a SPIR pulse, causing no SNR decrease differently from the STIR method. As being frequency selective fat suppress ion methods, however, these imaging methods are likely to be affected by a distribution of the magnetic field. If a static magnetic field B0 or an RF magnetic field B1 is spatially uneven, spatial fat distribution after the fat suppression is likely to be uneven.

Thus, an imaging method for enabling fat to be spatially evenly suppressed is proposed for the frequency selective fat suppression method of small SNR decrease. An imaging method for applying an SPIR pulse and further a CHESS pulse, and then starting data acquisition is disclosed, e.g., in Japanese Unexamined Patent Publication No. 2008-264499. As a fat signal having survived the SPIR method is further reduced by the application of a CHESS pulse, the fat signal can be suppressed spatially evenly and to a great extent according to that imaging method.

As fat can be suppressed spatially evenly and to a great extent, the fat suppression method disclosed in JP No. 2008-264499 is quite an effective imaging method from a viewpoint of fat suppression. Meanwhile, fat may be suppressed too much, resulting in inconvenience for image diagnosis in some cases. One example is an image diagnosis of a tumor in a breast, etc., with injection of contrast media. There are lots of mammary glands around the tumor. If there is a tumor, strength of a signal coming from the tumor is usually higher than strength of signals coming from circumferential mammary glands after the contrast media reaches a tumor part. If fat is moderately suppressed, a remaining, spatially broadened fat signal covers lots of mammary gland signals. The mammary gland signals thereby turn inconspicuous, and as a result the signal coming from the tumor can be easily identified.

Meanwhile, if fat is spatially evenly suppressed too much, the mammary gland signals turn conspicuous. As the number of the mammary glands is large in particular, identification of the tumor signal turns difficult because of mammary gland signals around the tumor even if the strength of the signal coming from the tumor is higher than the strength of the signals coming from the mammary glands.

Thus, a magnetic resonance imaging apparatus which does not simply increase an extent of fat suppression but can adjust the extent of suppression to a desirable value is requested.

SUMMARY

A magnetic resonance imaging apparatus of an embodiment has a setting unit configured to set a pulse sequence having a pre-pulse for fat suppression and a pulse train for data acquisition for acquiring echo data for image reconstruction, the pulse sequence being provided with a plurality of dummy pulses between the pre-pulse for fat suppression and the head of the pulse train for data acquisition, a data acquisition unit configured to apply an RF pulse and a gradient magnetic field pulse based on the pulse sequence set by the setting unit to a test object so as to acquire the echo data, and an image generation unit configured to reconstruct an image of the test object from the acquired echo data, wherein an application time during which the plural dummy pulses are applied or flip angles of the plural dummy pulses can be adjusted.

BRIEF DESCRIPTION OF DRAWINGS

FIGS. 2A-2B illustrate an exemplary ordinary pulse sequence having a good fat suppression characteristic;

FIGS. 5A-5B illustrate an exemplary pulse sequence of a second embodiment;

FIGS. 9A-9C illustrate another example of a fat suppression pre-pulse of the second embodiment;

FIGS. 10A-10B illustrate an exemplary pulse sequence of a third embodiment;

DESCRIPTION OF EMBODIMENTS

An embodiment of the invention will be explained below on the basis of the drawings.

(1) Magnetic Resonance Imaging Apparatus

Figure 1:
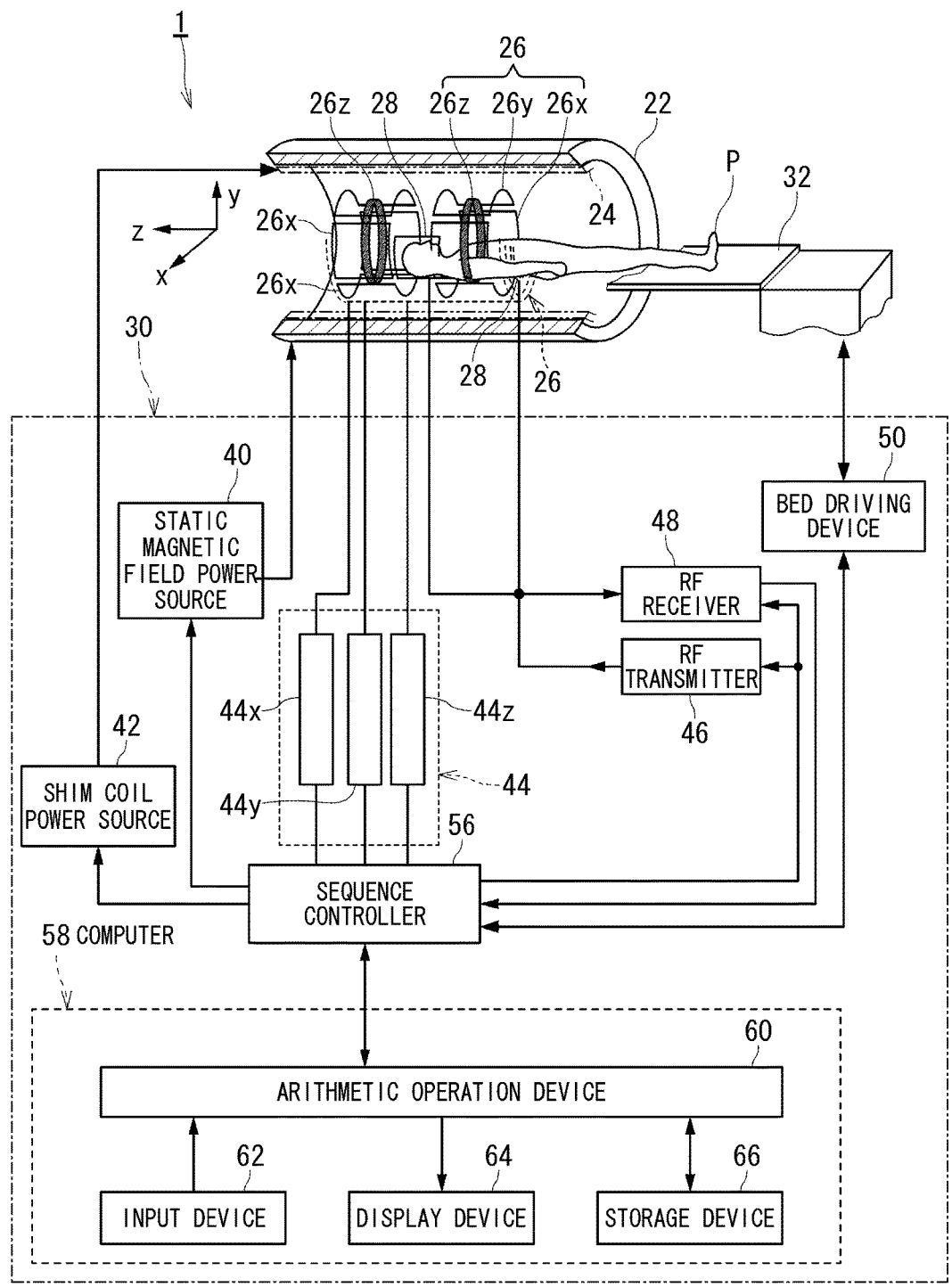
FIG. 1 illustrates an exemplary entire constitution of a magnetic resonance imaging apparatus.

FIG. 1 is a block diagram which shows an entire constitution of a magnetic resonance imaging apparatus of the embodiment. As shown in FIG. 1, the magnetic resonance imaging apparatus 1 has a cylindrical magnet for static magnetic field 22 which forms a static magnetic field, a cylindrical shim coil 24 provided coaxially with and inside the magnet for static magnetic field 22, a gradient magnetic field coil 26, an RF coil 28 for transmission or receiving, a control system 30, a bed 32 on which a test object P (patient) can be mounted, etc. Further, the control system 30 has a static magnetic field power source 40, a shim coil power source 42, a gradient magnetic field power source 44, an RF transmitter 46, an RF receiver 48, a bed driving device 50, a sequence controller 56, a computer 58, etc. Further, the computer 58 has an arithmetic operation device 60, an input device 62, a display device 64, a storage device 66, etc., as its internal portions.

The magnet for static magnetic field 22 is coupled with the static magnetic field power source 40, and forms a static magnetic field in imaging space by means of a current supplied by the static magnetic field power source 40. The shim coil 24 is coupled with the shim coil power source 42, and levels the static magnetic field off by means of a current supplied by the shim coil power source 42. The magnet for static magnetic field 22 is formed by a superconductive coil in lots of cases, and is coupled with the static magnetic field power source 40 so as to be supplied with a current in case of being excited. Once being excited, the magnet for static magnetic field 22 is decoupled in general. Incidentally, the magnet for static magnetic field 22 may be formed by a permanent magnet without being provided with the static magnetic field power source 40.

The gradient magnetic field power source 44 is formed by an X-axis gradient magnetic field power source 44x, a Y-axis gradient magnetic field power source 44y and a Z-axis gradient magnetic field power source 44z. Incidentally, in FIG. 1, let a direction of axes of the magnet for static magnetic field 22 and the shim coil 24 be a Z-axis, let a vertical direction be a Y-axis and let a direction perpendicular to those be an X-axis.

The gradient magnetic field coil 26 has an X-axis gradient magnetic field coil 26x, a Y-axis gradient magnetic field coil 26y and a Z-axis gradient magnetic field coil 26z. The gradient magnetic field coil 26 is shaped like a cylinder inside the magnet for static magnetic field 22. The X-, Y- and Z-axis gradient magnetic field coils 26x, 26y and 26z are coupled with the X-, Y- and Z-axis gradient magnetic field power sources 44x, 44y and 44z, respectively.

The X-, Y- and Z-axis gradient magnetic field power sources 44x, 44y and 44z each provide the X-, Y- and Z-axis gradient magnetic field coils 26*x*, 26*y* and 26*z* with an electric current, respectively, so that gradient magnetic fields Gx, Gy and Gz are formed in the directions of the X-, Y- and Z-axes in the imaging space, respectively.

Gradient magnetic fields Gx, Gy and Gz in three directions in an apparatus coordinate system are combined, so that logical axes which are a slice direction gradient magnetic field Gss, a phase encode direction gradient magnetic field Gpe and a read out direction (frequency encode direction) gradient magnetic field Gro each can be set in any direction. The static magnetic field is overlaid with each of the gradient magnetic fields in the slice, phase encode and read out directions.

The RF transmitter 46 generates an RF pulse of a Larmor frequency for producing a nuclear magnetic resonance on the basis of control information provided by the sequence controller 56, and transmits the RF pulse to the RF coil 28 for transmission. The RF coil 28 may be a whole body coil (WBC) for transmission and receiving to transmit an RF pulse and to receive a magnetic resonance signal (MR signal) from the test object, a coil (called a local coil, as well) only for receiving provided close to the bed 32 or the test object P, etc.

18*a* The MR signal received by the RF coil 28 is provided to the RF receiver 48 via a signal cable.

The RF receiver 48 carries out various kinds of data processing such as pre-amplification, intermediate frequency conversion, phase detection, baseband frequency amplification, filtering and so on for the detected MR signal, and then A/D (analog to digital)-converts the MR signal so as to generate raw data which is digitized complex data. The RF receiver 48 outputs the produced raw data of the MR signal to the sequence controller 56.

The arithmetic operation device 60 is formed by having a processor, etc., controls the entire magnetic resonance imaging apparatus 1 as a system, and carries out an image reconstruction process and various kinds of image processing.

The sequence controller 56 generates the gradient magnetic fields Gx, Gy and Gz and an RF pulse according to specific imaging conditions or a pulse sequence stored in the storage device 66 in the computer 58, and instructions based on those by the arithmetic operation device 60. Further, the sequence controller 56 is provided by the RF receiver 48 with an MR signal received in response to the gradient magnetic fields Gx, Gy and Gz and the RF pulse as raw data, and outputs the raw data to the arithmetic operation device 60.

The arithmetic operation device 60 carries out a reconstruction process including inverse Fourier transform, etc., and various kinds of image processing on the provided raw data so as to generate image data of the test object. The generated image data is displayed on the display device 64. The input device 62 is used for user operation to input imaging conditions and various kinds of information.

The arithmetic operation device 60 of the embodiment described above works as a setting unit which sets imaging conditions including various kinds of pulse sequences. The setting unit sets a pulse sequence including a fat suppression pre-pulse and a pulse train for data acquisition for acquiring echo data for image reconstruction described later. The setting unit sets an adjustable delay time to be put between the fat suppression pre-pulse and the head of the pulse train for data acquisition, the number of dummy pulses, etc., as well.

The sequence controller 56 drives the RF transmitter 46 and the gradient magnetic field power source 44 on the basis of the imaging conditions such as the pulse sequence, etc., set by the setting unit, and applies an RF pulse and a gradient magnetic field pulse based on the pulse sequence having been set to the test object via the RF coil 28 and the gradient magnetic field coils 26*x*, 26*y* and 26*z*. The test object produces a magnetic resonance signal (MR signal) in response to the applications, which is received by the RF receiver 48 and is transmitted to the sequence controller 56 as echo data (raw data). The sequence controller 56, the RF transmitter 46, the gradient magnetic field power source 44, the RF coil 28, the gradient magnetic field coils 26*x*, 26*y* and 26*z*, the RF receiver 48, etc., form a data acquisition unit of the embodiment in this way.

The arithmetic operation device 60 carries out an image reconstruction process including inverse Fourier transform, etc., and various kinds of image processing on the echo data (raw data) transmitted to the sequence controller 56, so as to generate image data of the test object. That is, the arithmetic operation device 60 works as an image generation unit of the embodiment.

(2) Pulse Sequence

First Embodiment

Various kinds of pulse sequences are proposed as imaging methods for suppressing a fat signal being an unwanted signal as described above. FIG. 2A illustrates an exemplary pulse sequence for fat suppression disclosed in JP No. 2008-264499 as an ordinary example. Further, FIG. 2B schematically illustrates how vertical magnetization of a fat signal changes in the pulse sequence. According to the pulse sequence illustrated in FIG. 2A, a frequency selective RF pulse, i.e., an SPIR pulse (first fat suppression pulse) having a resonance frequency of fat and a CHESS pulse (second fat suppression pulse) similarly having a resonance frequency of fat are applied to the test object as a pre-pulse preceding data acquisition. The flip angle of the SPIR pulse is usually set between 90 and 180 degrees. Further, the flip angle of the CHESS pulse is set to 90 degrees.

If the SPIR pulse is applied, the vertical magnetization of fat falls frequency selectively by an angle according to the flip angle as illustrated in FIG. 2B. As the flip angle of the SPIR pulse is between 90 and 180 degrees, the vertical magnetization of fat turns negative immediately after the application. Then, the vertical magnetization of fat increases as time passes owing to vertical relaxation, and recovers from the negative value, by way of a null point and up to a positive value. A recovery rate of the vertical magnetization is determined by the vertical relaxation (T1 relaxation) of fat. Let a period of time between the application of the SPIR pulse and the recovery of the vertical magnetization up to the null point be called inversion time (TI) in this imaging method. In the pulse sequence illustrated in FIG. 2A, the CHESS pulse is applied inversion time (TI) after the SPIR pulse is applied.

The vertical magnetization of fat passes through the null point at any location in the space inversion time after the SPIR pulse is applied in ideal condition such that the static magnetic field (B0) and the RF magnetic field (B1) are spatially completely even and that the vertical relaxation time of fat is of one and the same value without exception. The static magnetic field (B0) is not spatially completely even in reality, though, and neither is the RF magnetic field (B1). As a result, vertical magnetization-M0' immediately after the SPIR pulse is applied is not spatially completely even as illustrated in FIG. 2B, and does not completely reach zero after the inversion time TI passes.

Thus, the CHESS pulse is applied as a second fat suppression pulse inversion time TI after the SPIR pulse is applied in the pulse sequence illustrated in FIG. 2A. The application of the CHESS pulse makes vertical magnetization of fat surviving after the inversion time TI passes fall by 90 degrees. Then, apply a spoiler pulse as illustrated in FIG. 2A so that a horizontal magnetization component of fat disperses and disappears. Then, acquire the echo data while changing a phase encoding quantity by using a pulse train according to, e.g., an FFE (Fast Field Echo) method, i.e., a plurality of excitation pulses of small flip angles.

The fat signal can be spatially evenly and sufficiently suppressed in the pulse sequence illustrated in FIG. 2A by the use of two frequency selective fat suppression pulses which are the SPIR and CHESS pulses.

Figure 3:
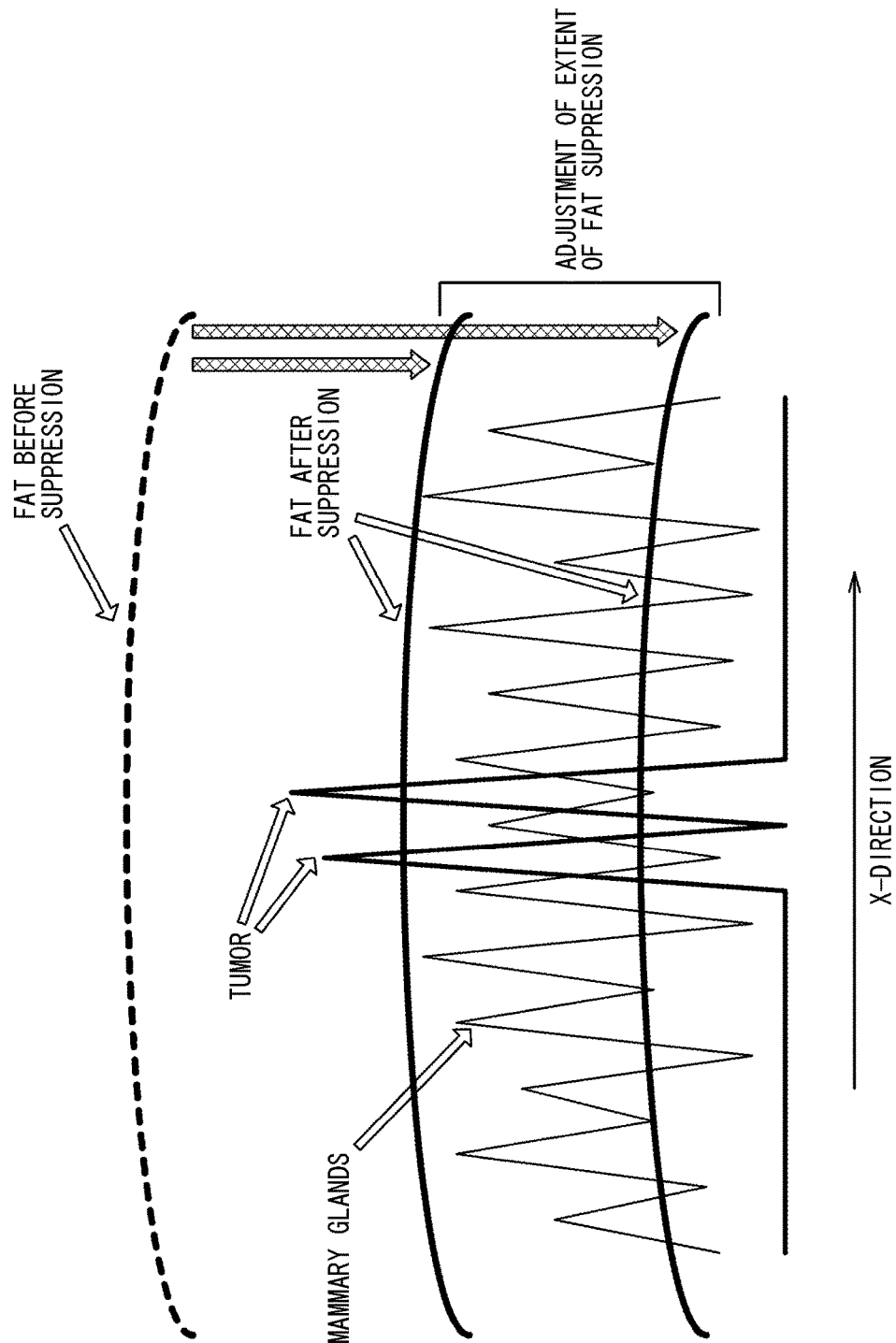
FIG. 3 explains background why adjustment of an extent of fat suppression is desired.

In some cases, however, fat may be suppressed too much, resulting in inconvenience for image diagnosis as described above. FIG. 3 illustrates an example of such a case. FIG. 3 conceptually illustrates a one-dimensionally viewed (e.g., in the X direction) diagnosis image for diagnosing a tumor in a breast, etc., with injection of contrast media. There are lots of mammary glands around the tumor. If there is a tumor, strength of a signal coming from the tumor is usually higher than strength of signals coming from circumferential mammary glands after the contrast media reach a tumor part. If fat is moderately suppressed, a remaining, spatially broadened fat signal covers lots of mammary gland signals. The mammary gland signals thereby turn inconspicuous, and as a result the signal coming from the tumor can be easily identified. Meanwhile, if fat is spatially evenly suppressed too much, the mammary gland signals turn conspicuous. As the number of the mammary glands is large in particular, identification of the tumor signal turns difficult because of mammary gland signals around the tumor even if the strength of the signal coming from the tumor is higher than the strength of the signals coming from the mammary glands. Such a tendency turns conspicuous particularly on an MIP (maximum intensity projection) image.

In a pulse sequence of the embodiment described below, provide an adjustable parameter in the pulse sequence, and adjust the parameter so that the extent of fat suppression can be adjusted, instead of evenly determining the extent of fat suppression. As a result, detection of a tumor signal from lots of mammary gland signals is facilitated. The pulse sequence of the embodiment will be specifically explained below.

Figure 4A:
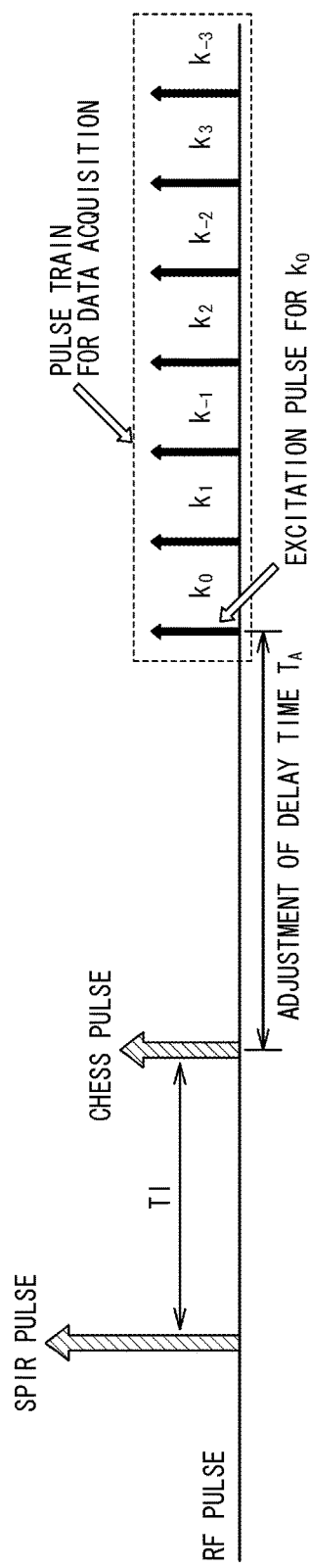
FIGS. 4A-4B illustrate an exemplary pulse sequence of a first embodiment.
Figure 4B:
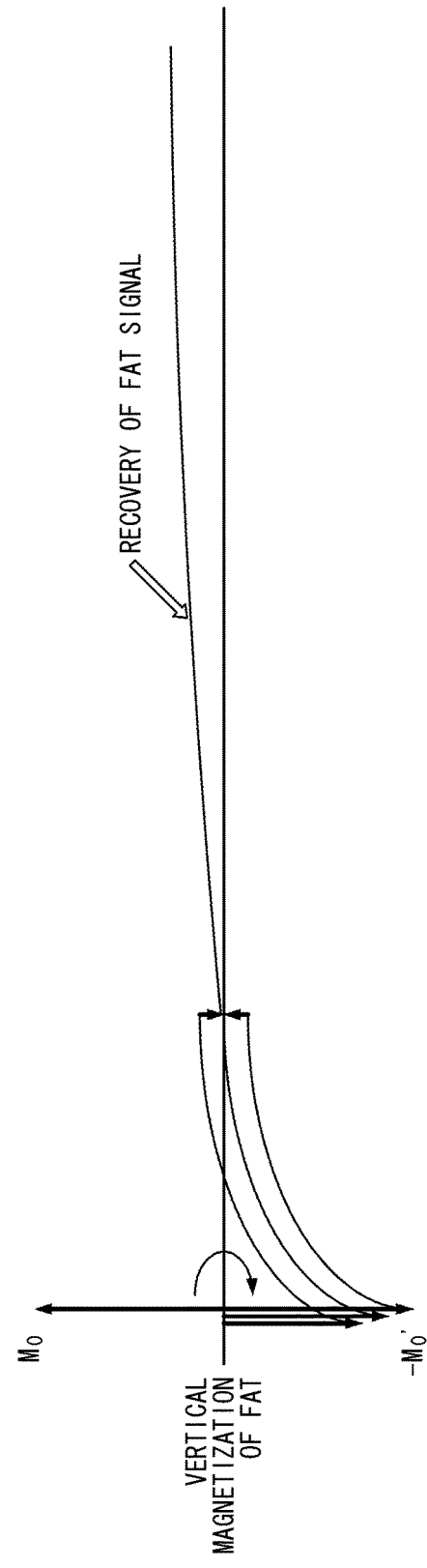

FIG. 4A illustrates a pulse sequence of the first embodiment, and FIG. 4B schematically illustrates how vertical magnetization of a fat signal behaves. Two frequency selective fat suppression pulses which are SPIR and CHESS pulses are used as a pre-pulse for fat suppression in the pulse sequence of the first embodiment similarly as in FIG. 2A. The pulse sequence of the first embodiment, however, significantly differs from the ordinary pulse sequence illustrated in FIG. 2A in that an adjustable delay time $T_A$ is provided between a pulse train for data acquisition and the pre-pulse for fat suppression.

The vertical magnetization of fat made fall down to a negative value by the SPIR pulse recovers up to around the null point after the inverse time TI passes, and is sufficiently suppressed owing to the CHESS pulse applied at that time as described above. If the pulse train begins immediately after the CHESS pulse is applied, data can be acquired in condition such that fat is suppressed to quite a great extent. It may be undesirable for image diagnosis to suppress the fat signal too much in some cases, though.

Meanwhile, the fat signal suppressed down to zero by the applied CHESS pulse then gradually recovers. An extent of recovery of the fat signal, i.e., an amplitude of the fat signal depends upon a period of time which passes after the CHESS pulse is applied.

Thus, the delay time $T_A$ during which nothing is applied is provided between the application of the pre-pulse for fat suppression (more specifically, the application of the CHESS pulse) and the head of the pulse train for data acquisition in the pulse sequence of the first embodiment. The delay time $T_A$ is properly adjusted so that the extent of recovery of the once suppressed fat signal is adjusted, and that the extent of fat suppression is resultantly adjusted.

(3) Second Embodiment

FIG. 5A illustrates a pulse sequence of a second embodiment, and FIG. 5B schematically illustrates how vertical magnetization of a fat signal behaves according to the pulse sequence. The second embodiment differs from the first embodiment in that, while an adjustable delay time during which nothing is applied is provided between the pre-pulse for fat suppression and the head of the pulse train for data acquisition in the pulse sequence of the first embodiment, a plurality of dummy pulses are provided between the pre-pulse for fat suppression and the head of the pulse train for data acquisition in the pulse sequence of the second embodiment.

The dummy pulses are each an RF pulse not accompanied by data acquisition, and an interval between the dummy pulses is set to a same interval as the interval between each of the excitation pulses in the pulse train for data acquisition. Further, a center frequency of the dummy pulses agrees with not a resonance frequency of an unwanted fat signal but a resonance frequency of a desired water signal.

Although the extent of fat signal suppression can be adjusted to a desirable value owing to the adjustable delay time provided in the pulse sequence of the first embodiment, a transitional change may occur in the desired signal (water signal in this case) as the pulse train for data acquisition begins immediately after the delay time passes, resulting in that an artifact may possibly be caused by the transitional change in the signal.

Meanwhile, as plural RF pulses of the same interval and the same frequency as those of the excitation pulses of the pulse train for data acquisition are provided as the dummy pulses in the pulse sequence of the second embodiment, excitation condition of the water signal has become steady when the pulse train for data acquisition begins, and steady water signals can be acquired immediately after the pulse train for data acquisition begins. The artifact caused by the above transitional change in the signal can be resultantly suppressed.

Meanwhile, as the center frequency of the dummy pulses differs from the resonance frequency of the fat signal, the behavior of the fat signal is not much affected by the application of the dummy pulses. Thus, adjustment of the number of the dummy pulses is substantially equivalent to adjustment of the extent of recovery of the fat signal through adjustment of the delay time following the application of the CHESS pulse.

Figure 6:
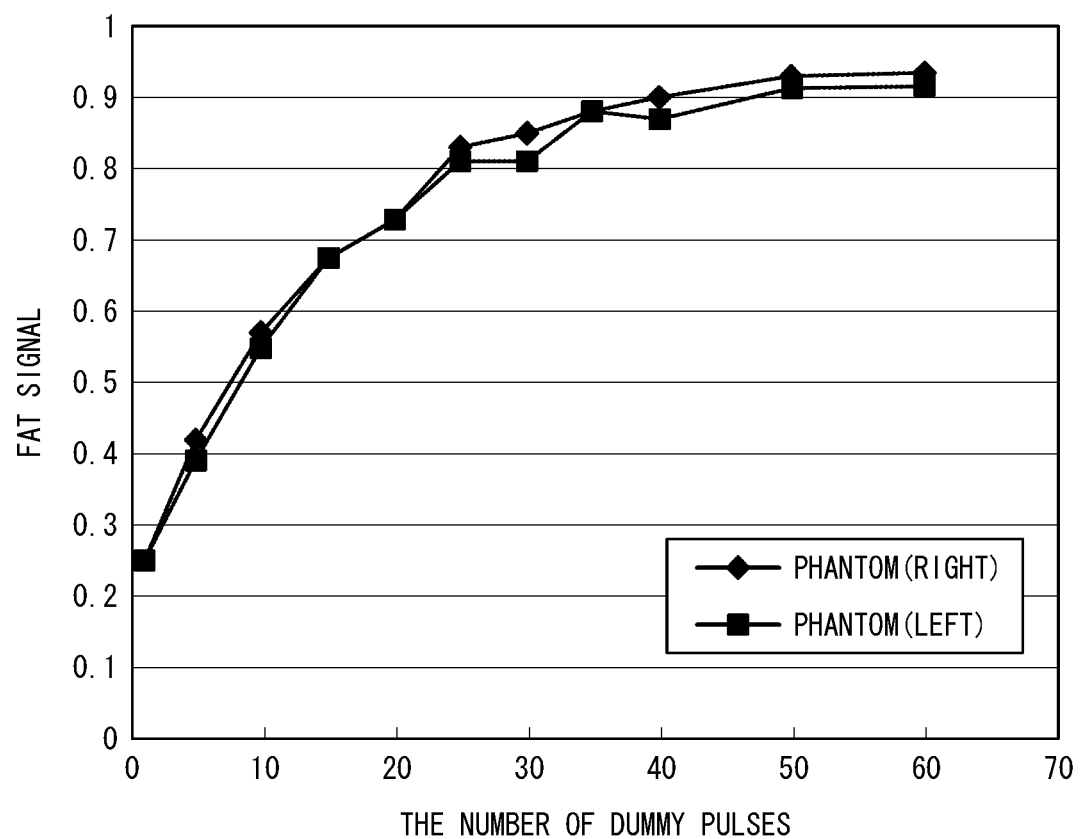
FIG. 6 illustrates a result of measurement of relationship between the number of dummy pulses and recovery of a fat signal.

FIG. 6 illustrates an exemplary result of measurement of the number of dummy pulses and an extent of recovery of a fat signal. Horizontal and vertical axes represent the number of dummy pulses and a normalized amplitude of a fat signal, respectively, in the drawing. The measurement was done in condition such that phantoms which simulate fat in a specific area are put on two left and right positions. It is known from FIG. 6 that the amplitude of the fat signal can be adjusted over a broad range by means of adjustment of the number of dummy pulses.

Figure 7:
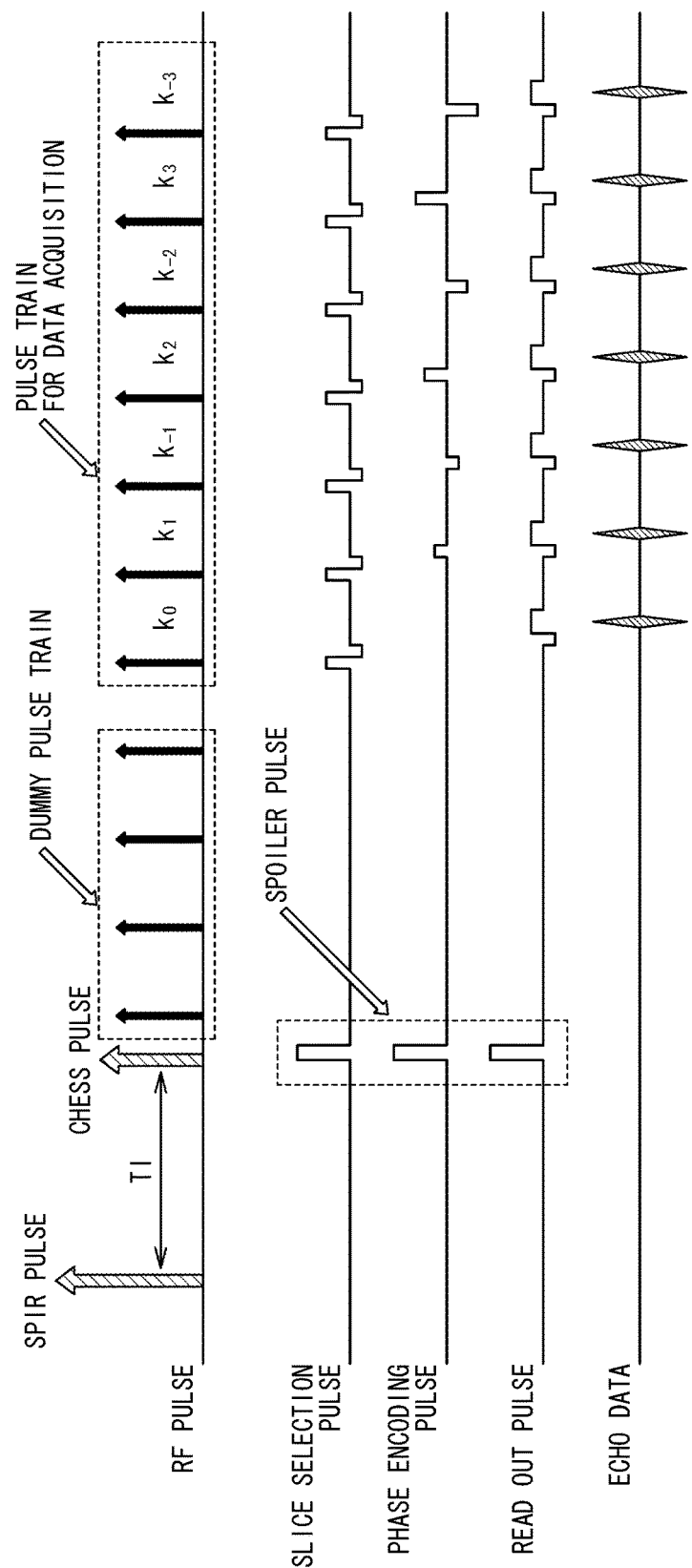
FIG. 7 illustrates an exemplary detailed pulse sequence of the second embodiment.

FIG. 7 illustrates a more specific example of the pulse sequence of the second embodiment. FIG. 7 illustrates RF pulses, gradient magnetic field pulses for slice selection, gradient magnetic field pulses for phase encoding, gradient magnetic field pulses for readout and eco data on top, second, third, fourth and bottom rows, respectively, in FIG. 7.

Incidentally, a pulse train according to an FFE (Fast Field Echo) method is used for the pulse train for data acquisition exemplarily illustrated in FIG. 7 and for a pulse train for data acquisition explained below, for which a plurality of excitation pulses of small flip angles is used so that echo data is acquired fast while a phase encoding quantity is being changed. The pulse train for data acquisition which can be applied to the embodiment is not limited to one according to the FFE method, though, and may be one according to, e.g., an SE (Spin Echo) method, a fast SE (FSE) method, an FASE (Fast Asymmetric SE) method, i.e., an FSE method combined with a half Fourier method, or an EPI (Echo Planar Imaging) method.

Meanwhile, a phase encoding quantity is preferably just or close to zero at the head of the pulse train for data acquisition of any kind. Echo data of a phase encoding quantity close to zero is important data which determines contrast of the entire image. Such echo data of a phase encoding quantity close to zero is provided close to the head of the pulse train for data acquisition, so that an image on which the extent of fat suppression after being adjusted is more sensitively reflected can be obtained.

Variations of a case where a phase encoding quantity is set to zero at the head of the pulse train for data acquisition are conceivable. FIG. 8 illustrates exemplary some of them.

Figure 8A:
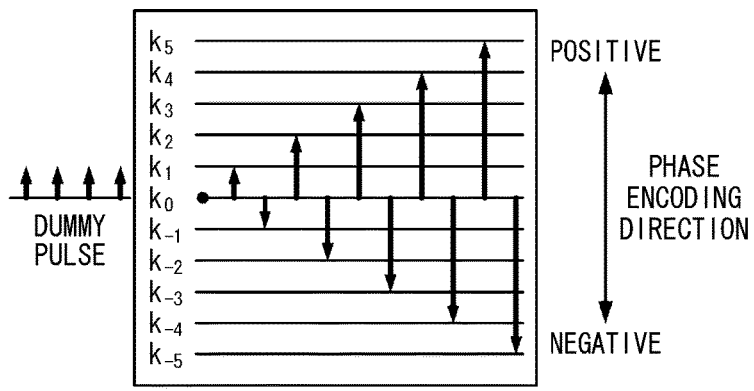
FIGS. 8A-8C exemplarily illustrate order of phase encoding in a pulse train for data acquisition.
Figure 8B:
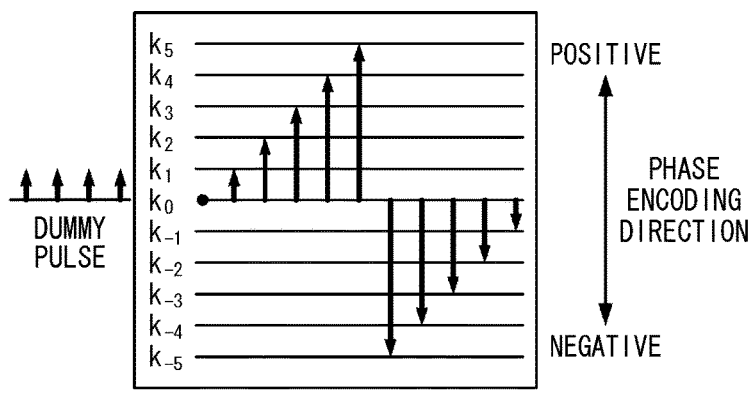
Figure 8C:
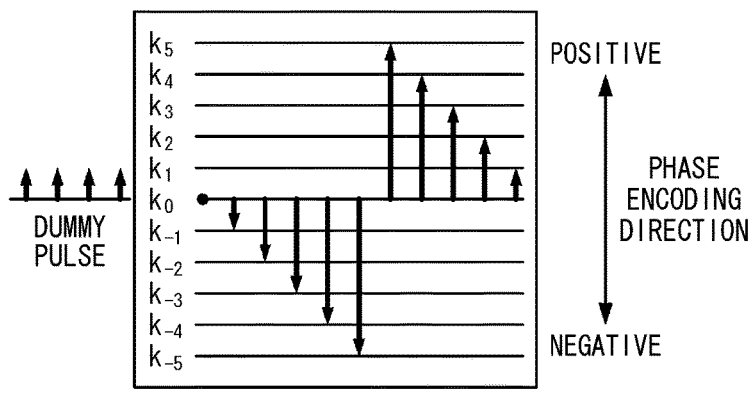

FIG. 8A illustrates order of phase encoding quantities in so called centric order. In the pulse train for data acquisition following the dummy pulses, echo data whose phase encoding quantity is zero ($k_0$) is acquired at first, and then the phase encoding quantity increases in sequence while its sign alternating between positive and negative such as $k_1$, $k_{-1}$, $k_2$, $k_{-2}$ and so on. FIG. 8B illustrates a sequence of phase encoding quantities in which the phase encoding quantities increase from zero ($k_0$) towards the positive after the dummy pulses, and then change the sign after reaching a positive maximum and decrease from a negative maximum towards zero. Further, FIG. 8C illustrates a sequence of phase encoding quantities in which the phase encoding quantities increase from zero ($k_0$) towards the negative after the dummy pulses in a manner opposite to FIG. 8B, and then change the sign after reaching a negative maximum and decrease from a positive maximum towards zero.

A user can input a specific value to the adjustable delay time $T_A$ of the first embodiment or the adjustable number of the dummy pulses of the second embodiment via the input device 62. Further, the second embodiment may be configured in such a way that the user inputs the delay time $T_A$ and the inputted delay time $T_A$ is divided by an interval (TR) separately set between the excitation pulses in the pulse train for data acquisition so that the number of the dummy pulses are calculated. The apparatus carries out the division. In this case, as the delay time $T_A$ remains constant even if the interval between the excitation pulses changes, fat signal strength of a same extent of suppression is obtained every time.

Further, if the extent of fat suppression is ranked into, e.g., three categories such as "large", "middle" and "small", the user may input those categories as delay information related to the delay time instead of directly inputting the delay time $T_A$ or the number of the dummy pulses. If that is the case, the apparatus sets a value for the delay time $T_A$ allotted beforehand according to the categories "large", "middle" and "small" or the number of the dummy pulses, so that a workload of user's operation can be reduced.

An exemplary combination of the two frequency selective fat suppression pulses formed by the SPIR and CHESS pulses are explained above as the fat suppression pre-pulse. The fat suppression pre-pulse of the embodiment is not limited to that.

As illustrated in FIG. 9A, e.g., a combination of an SPIR pulse and two consecutive CHESS pulses which are substantially equally located may be a fat suppression pre-pulse. Meanwhile, one CHESS pulse may be a fat suppression pre-pulse as illustrated in FIG. 9B. Further, one SPIR pulse may be a fat suppression pre-pulse as illustrated in FIG. 9C. In case of FIG. 9C, the adjustable delay time is a period of time since the vertical magnetization of fat made fall by the SPIR pulse reaches zero until the head of the pulse train for data acquisition. Further, the dummy pulses are put between the time when the vertical magnetization of fat reaches zero and the head of the pulse train for data acquisition.

(4) Third Embodiment

FIG. 10A illustrates a pulse sequence of a third embodiment, and FIG. 10B schematically illustrates how vertical magnetization of a fat signal behaves according to the pulse sequence. The third embodiment differs from the second embodiment in that, while a flip angle of a dummy pulse in the pulse sequence of the second embodiment equals a flip angle of an excitation pulse in the pulse train for data acquisition, a flip angle of a dummy pulse of the third embodiment is set larger than a flip angle of an excitation pulse in the pulse train for data acquisition.

While a flip angle of each of excitation pulses in the pulse train for data acquisition (FFE method) is 10 to 20 degrees, e.g., a flip angle of a dummy pulse is set larger, e.g., 60 degrees.

It is known that a quantity of fat recovery increases if a flip angle of a dummy pulse is set large, as illustrated in FIG. 10B. This characteristic is used for the third embodiment, and a flip angle of a dummy pulse is set larger than a flip angle of an excitation pulse in the pulse train for data acquisition. A period of time for fat recovery can resultantly be shortened, and a desired extent of fat suppression can be achieved by the use of a smaller number of dummy pulses. The pulse sequence is thereby entirely shortened, and data acquisition time can be shortened.

Another modification of the third embodiment may be such that the flip angles of the respective dummy pulses are not rendered fixed but changeable. An exemplary setting is such that the flip angles of the respective dummy pulses gradually increase in order that the change in the flip angles of the dummy pulses ismoderate. If a flip angle of an excitation pulse is 20 degrees, e.g., change the flip angles of the dummy pulses linearly from 20 to 60 degrees.

(5) Fourth Embodiment

Figure 11A:
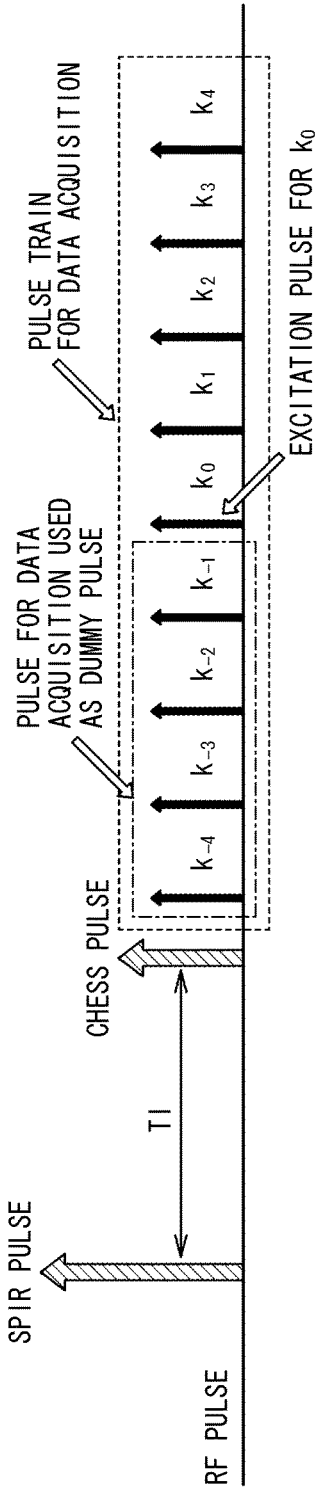
FIGS. 11A-11B illustrate an exemplary pulse sequence of a fourth embodiment.
Figure 11B:
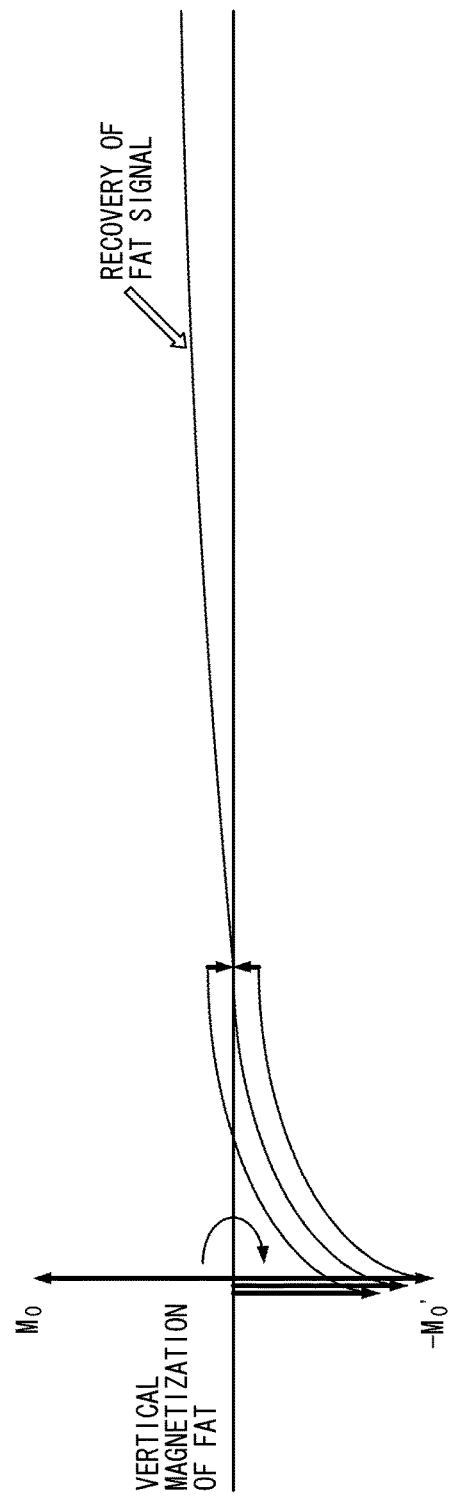

FIG. 11A illustrates a pulse sequence of a fourth embodiment, and FIG. 11B schematically illustrates how vertical magnetization of a fat signal behaves. The fourth embodiment does not much differ from the first to third embodiments in the behavior of vertical magnetization itself. In the pulse sequences of the previous embodiments, a delay time during which no data is acquired is provided between the pre-pulse for fat suppression and the pulse train for data acquisition (first embodiment), or a dummy pulse accompanied by no data acquisition is provided between the pre-pulse for fat suppression and the pulse train for data acquisition (second and third embodiments).

Meanwhile, a pulse sequence of the fourth embodiment is such that, while a pulse train for data acquisition is provided immediately after the pre-pulse for fat suppression, an adjustable number of plural excitation pulses each corresponding to a phase encoding quantity excepting zero is provided between an excitation pulse corresponding to a phase encoding quantity of zero ($k_0$) in the pulse train for data acquisition and the head of the pulse train for data acquisition.

Figure 12A:
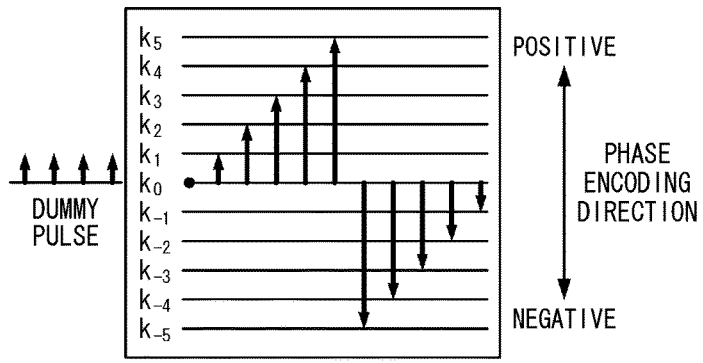
FIGS. 12A-12C illustrate a first example of order of phase encoding in a pulse train for data acquisition of the fourth embodiment.

FIG. 12A is the same as FIG. 8B which illustrates an exemplary sequence of phase encoding of the second embodiment. According to the second embodiment, the dummy pulses are followed by a pulse train for data acquisition starting from the phase encoding quantity of zero ($k_0$).

Figures 12B, 12C:
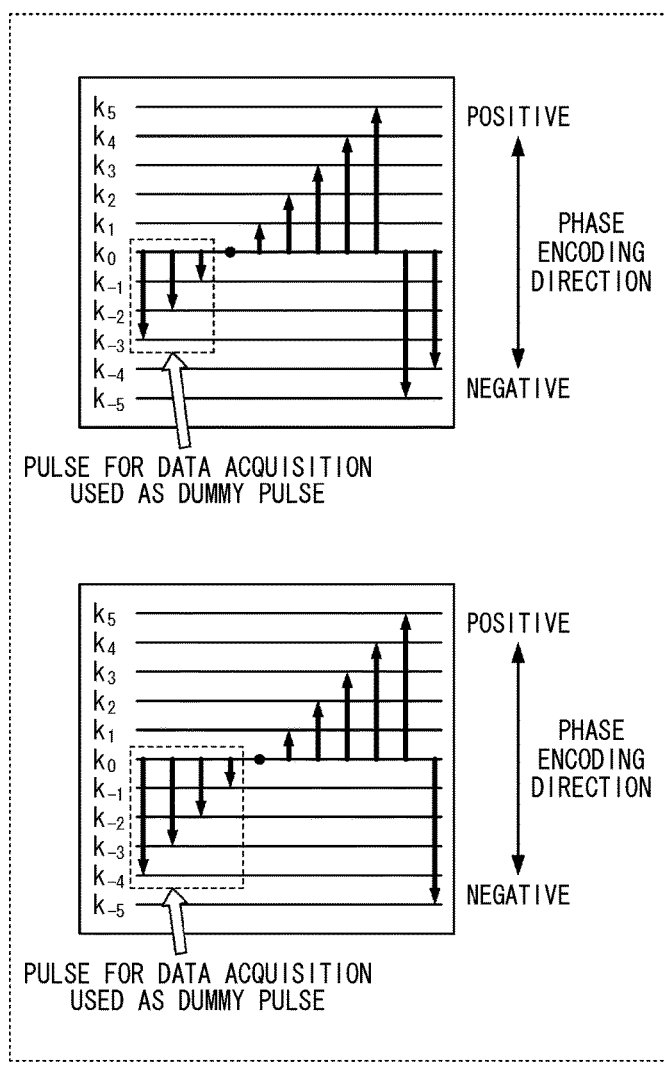

Meanwhile, FIG. 12B illustrates an exemplary sequence of phase encoding of the fourth embodiment, and so does FIG. 12C. As illustrated in FIG. 12B or in FIG. 12C, acquisition of echo data to be used for image reconstruction begins immediately after the pre-pulse for fat suppression, where no dummy pulses are provided. An excitation pulse corresponding to the phase encoding quantity of zero ($k_0$) is not at the head but in the middle of the pulse train for data acquisition, though, differently from the previous embodiments. Then, plural excitation pulses for acquiring echo data of phase encoding quantities excepting zero are arranged between the head of the pulse train for data acquisition and the phase encoding quantity of zero ($k_0$), where the number of the excitation pulses is adjustable. The number of the excitation pulses is adjusted between the head of the pulse train for data acquisition and the phase encoding quantity of zero ($k_0$), so that amplitude of a fat signal can be adjusted at the time of the phase encoding quantity of zero ($k_0$). That is, the excitation pulses arranged between the head of the pulse train for data acquisition and the phase encoding quantity of zero ($k_0$) each have a function of an excitation pulse for data acquisition and a function of a dummy pulse of the second and third embodiments together. The pulse sequence can resultantly be shortened, and data acquisition time can be shortened.

Suppose that the head of a pulse train for data acquisition corresponds to a negative phase encoding quantity, and that the phase encoding quantity increases from the negative phase encoding towards the positive in specific increments, as illustrated in FIGS. 12B and 12C. If the negative phase encoding quantity at the head is made adjustable in that case, the number of dummy pulses in a case where excitation pulses before the phase encoding quantity of zero ($k_0$) are each made work as a dummy pulse can be adjusted.

Figure 13A:
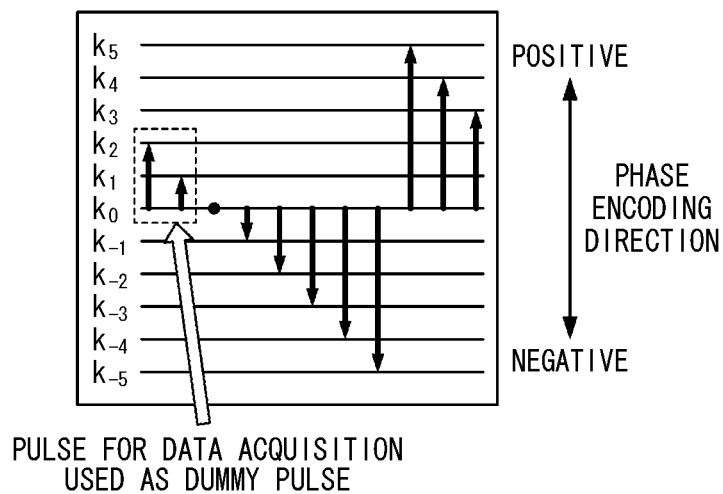
FIGS. 13A-13B illustrate a second example of order of phase encoding in a pulse train for data acquisition of the fourth embodiment.
Figure 13B:
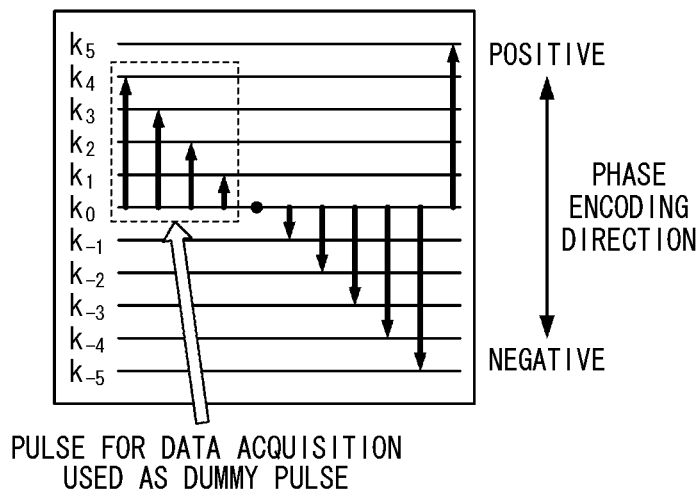

Meanwhile, suppose that the head of the pulse train for data acquisition corresponds to a positive phase encoding quantity, and that the phase encoding quantity decreases from the positive phase encoding towards the negative in specific decrements, as illustrated in FIGS. 13A and 13B. If the positive phase encoding quantity at the head is made adjustable in that case, the number of dummy pulses in a case where excitation pulses before the phase encoding quantity of zero ($k_0$) are each made work as a dummy pulse can be adjusted.

Figure 14A:
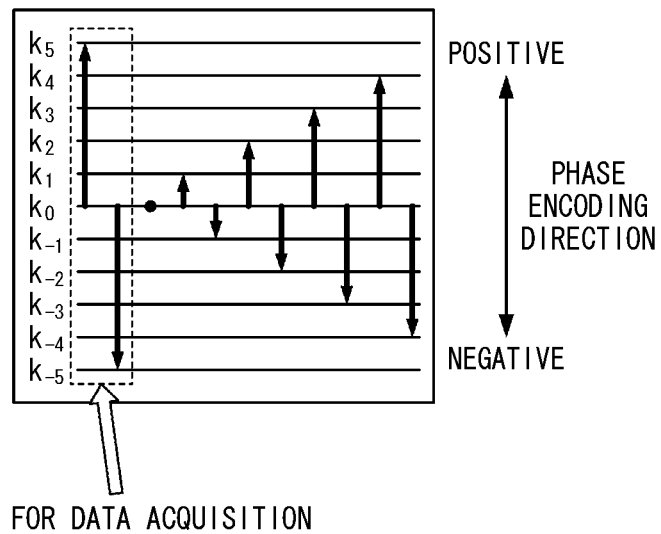
FIGS. 14A-14B illustrate a third example of order of phase encoding in a pulse train for data acquisition of the fourth embodiment.
Figure 14B:
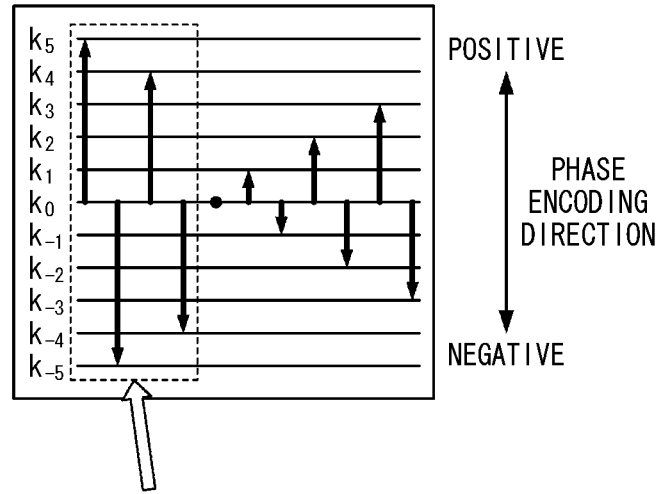

In addition, excitation pulses may be arranged between the head of the pulse train for data acquisition and the phase encoding quantity of zero ($k_0$) in descending order of absolute values of the phase encoding quantities as illustrated in FIGS. 14A and 14B, so that these excitation pulses corresponding to large phase encoding quantities are used as dummy pulses as well.

The magnetic resonance imaging apparatus having a pulse sequence of one of the embodiments described above can adjust an extent of fat suppression to a desirable value, instead of simply enlarging the extent of fat suppression, as explained above.

Although a couple of embodiments of the invention are explained, these embodiments are exemplary only and it is not intended that the scope of the invention is limited by the embodiments. These embodiments can be put into practice in other various forms, and can be variously omitted, replaced or changed within the scope of the invention. The embodiments and their modifications are included in the scope and the coverage of the invention, and similarly in the equivalents to the claimed invention.

What is claimed is:

1. A magnetic resonance imaging (MRI) apparatus comprising:
   static and gradient magnetic field generators and at least one radio frequency (RF) coil disposed to define an imaging volume and connected to control circuits including at least one processor programmed to
   set a pulse sequence having a pre-pulse for fat suppression and a pulse train for data acquisition for acquiring echo data for image reconstruction, the pulse sequence being provided with a plurality of dummy pulses between the pre-pulse for fat suppression and the head of the pulse train for data acquisition;
   adjust the number of said dummy pulses so as to adjust an application time period during which dummy pulses are applied thereby adjusting an extent of fat suppression;
   apply an RF pulse and a gradient magnetic field pulse based on the set pulse sequence, exhibiting said adjusted extent of fat suppression, to a test object so as to acquire the echo data; and
   reconstruct an image of the test object from the acquired echo data;
   wherein
   the pre-pulse for fat suppression includes a first pulse for fat suppression and a second pulse for fat suppression,
   the first pulse for fat suppression is an SPIR pulse which frequency selectively makes vertical magnetization of fat fall by a flip angle being larger than 90 degrees and smaller than 180 degrees,
   the second pulse for fat suppression is a CHESS pulse which frequency selectively makes vertical magnetization of fat fall by a flip angle by a flip angle of substantially 90 degrees,
   an interval between the SPIR pulse and the CHESS pulse is a period of time since the SPIR pulse is applied until the vertical magnetization of fat made fall by the SPIR pulse reaches zero, and
   the application time for the plural dummy pulses is an interval between the CHESS pulse and the head of the pulse train for data acquisition.

2. The magnetic resonance imaging apparatus according to claim 1, wherein the pulse train for data acquisition includes a plurality of excitation pulses, an interval between each of the plural excitation pulses equals an interval between each of the plural dummy pulses, and the application time for the plural dummy pulses can be adjusted by means of a change in the number of the dummy pulses.

3. The magnetic resonance imaging apparatus according to claim 2 wherein said at least one processor includes an operator input port further comprising an input unit to which application time information on the application time can be changeably inputted, the application time being set on the basis of the application time information having been inputted, and the number of the dummy pulses being calculated based upon a period of time between the pre-pulse for fat suppression and the head of the pulse train for data acquisition being divided by the interval of the excitation pulses.

4. The magnetic resonance imaging apparatus according to claim 1, wherein the pulse train for data acquisition is a pulse train such that echo data corresponding to a phase encoding quantity of zero is acquired at first.

5. The magnetic resonance imaging apparatus according to claim 4, wherein the pulse train for data acquisition is a pulse train such that echo data is acquired (a) in order of a phase encoding quantity according to centric order, (b) in order of a phase encoding quantity which increases in a positive direction from a phase encoding quantity of zero, and changes a sign after reaching a positive maximum and decreases from a negative maximum towards zero, or (c) in order of a phase encoding quantity which increases in a negative direction from a phase encoding quantity of zero, and changes a sign after reaching a negative maximum and decreases from a positive maximum towards zero.

6. The magnetic resonance imaging apparatus according to claim 1, wherein the pulse train for data acquisition is a pulse train according to an FFE (Fast Field Echo) method.

7. A magnetic resonance imaging (MRI) apparatus comprising:

static and gradient magnetic field generators and at least one radio frequency (RF) coil disposed to define an imaging volume and connected to control circuits including at least one processor programmed to set a pulse sequence having a pre-pulse for fat suppression and a pulse train for data acquisition for acquiring echo data for image reconstruction, the pulse sequence being provided with a plurality of dummy pulses between the pre-pulse for fat suppression and the head of the pulse train for data acquisition;

adjust the number of said dummy pulses so as to adjust an application time period during which dummy pulses are applied thereby adjusting an extent of fat suppression;

apply an RF pulse and a gradient magnetic field pulse based on the set pulse sequence, exhibiting said adjusted extent of fat suppression, to a test object so as to acquire the echo data; and reconstruct an image of the test object from the acquired echo data, wherein the pre-pulse for fat suppression is a CHESS pulse which frequency selectively makes vertical magnetization of fat fall by a flip angle of substantially 90 degrees;

wherein the pre-pulse for fat suppression further includes a SPIR pulse which frequency selectively makes vertical magnetization of fat fall by a flip angle being larger than 90 degrees and smaller than 180 degrees, the SPIR pulse being arranged before the CHESS pulse, an interval between the SPIR pulse and the CHESS pulse is a period of time since the SPIR pulse is applied until the vertical magnetization of fat made fall by the SPIR pulse reaches zero, and the application time is a period of time between the CHESS pulse and the head of the pulse train for data acquisition.

8. The magnetic resonance imaging apparatus according to claim 7 wherein said at least one processor includes an input port to which delay information on the application time can be changeably inputted, wherein the application time being set on the basis of the delay information having been inputted.

9. A magnetic resonance imaging (MRI) apparatus comprising:

static and gradient magnetic field generators and at least one radio frequency (RF) coil disposed to define an imaging volume and connected to control circuits including at least one processor programmed to set a pulse sequence having a pre-pulse for fat suppression and a pulse train for data acquisition for acquiring echo data for image reconstruction, the pulse train for data acquisition being arranged immediately after the pre-pulse for fat suppression;

apply an RF pulse and a gradient magnetic field pulse based on the set pulse sequence to a test object so as to acquire the echo data; and reconstruct an image of the test object from the acquired echo data, wherein the pulse sequence includes a plurality of excitation pulses between the head of the pulse train and an excitation pulse which corresponds to zero phase encoding, the number of the plurality of excitation pulses is adjusted such that a respectively corresponding adjustment of fat suppression is achieved, the pre-pulse for fat suppression includes a first pulse for fat suppression and a second pulse for fat suppression, the first pulse for fat suppression is an SPIR pulse which frequency selectively makes vertical magnetization of fat fall by a flip angle being larger than 90 degrees and smaller than 180 degrees, the second pulse for fat suppression is a CHESS pulse which frequency selectively makes vertical magnetization of fat fall by a flip angle by a flip angle of substantially 90 degrees, an interval between the SPIR pulse and the CHESS pulse is a period of time since the SPIR pulse is applied until the vertical magnetization of fat made fall by the SPIR pulse reaches zero.

10. The magnetic resonance imaging apparatus according to claim 9, wherein the pulse train for data acquisition is a pulse train such that the head corresponds to a negative phase encoding quantity, that the phase encoding quantity increases in specific increments in a positive direction from the negative phase encoding quantity, and that the negative phase encoding quantity at the head is adjustable.

11. The magnetic resonance imaging apparatus according to claim 9, wherein the pulse train for data acquisition is a pulse train such that the head corresponds to a positive phase encoding quantity, that the phase encoding quantity decreases in specific decrements in a negative direction from the positive phase encoding quantity, and that the positive phase encoding quantity at the head is adjustable.

12. A magnetic resonance imaging (MRI) apparatus comprising:
   set a pulse sequence having a pre-pulse for fat suppression and a pulse train for data acquisition for acquiring echo data for image reconstruction, the pulse sequence being provided with a plurality of dummy pulses between the pre-pulse for fat suppression and the head of the pulse train for data acquisition;
   apply an RF pulse and a gradient magnetic field pulse based on the pulse sequence set by the setting unit to a test object so as to acquire the echo data; and
   reconstruct an image of the test object from the acquired echo data,
   wherein the pulse train includes a plurality of excitation pulses, and
   a flip angle of at least one of the dummy pulses is set larger than a flip angle of each of the excitation pulses.

13. The magnetic resonance imaging apparatus according to claim 12, wherein the flip angle of each of the dummy pulses is set to gradually increase.

* * * * *